United States Patent [19]
Rutten et al.

[11] Patent Number: 6,071,803
[45] Date of Patent: Jun. 6, 2000

[54] ELECTRICAL CONTACT TO BURIED SOI STRUCTURES

[75] Inventors: Matthew J. Rutten, Milton; Steven H. Voldman, South Burlington, both of Vt.

[73] Assignee: International Business Machines Corporation, Armonk, N.Y.

[21] Appl. No.: 09/192,586

[22] Filed: Nov. 17, 1998

Related U.S. Application Data

[62] Division of application No. 08/835,128, Apr. 4, 1997, Pat. No. 5,889,293.

[51] Int. Cl.[7] ........................ H01L 21/00; H01L 21/4763
[52] U.S. Cl. .......................... 438/618; 438/149; 438/161; 438/622
[58] Field of Search .................................. 438/618, 149, 438/161, 164, 180, 181, 622, 624, 625

[56] References Cited

U.S. PATENT DOCUMENTS

| | | | |
|---|---|---|---|
| 3,791,024 | 2/1974 | Boleky, III | 29/577 |
| 4,104,086 | 8/1978 | Bondur et al. | 148/1.5 |
| 4,256,514 | 3/1981 | Pogge | 148/1.5 |
| 4,283,249 | 8/1981 | Ephrath | 156/643 |
| 4,473,598 | 9/1984 | Ephrath et al. | 427/86 |
| 4,505,893 | 3/1985 | Mori et al. | 424/94 |
| 4,889,829 | 12/1989 | Kawai | 437/69 |
| 4,907,053 | 3/1990 | Ohmi | 357/23.1 |
| 4,989,057 | 1/1991 | Lu | 357/23.7 |
| 5,258,318 | 11/1993 | Buti et al. | 437/34 |
| 5,308,782 | 5/1994 | Mazure et al. | 438/154 |
| 5,312,777 | 5/1994 | Cronin et al. | 437/195 |
| 5,371,401 | 12/1994 | Kurita | 257/524 |
| 5,376,562 | 12/1994 | Fitch et al. | 438/155 |
| 5,399,507 | 3/1995 | Sun | 437/24 |
| 5,470,776 | 11/1995 | Ryou | 438/152 |
| 5,521,401 | 5/1996 | Zamanian et al. | 257/67 |
| 5,604,137 | 2/1997 | Yamazaki et al. | 438/153 |
| 5,606,186 | 2/1997 | Noda | 257/226 |
| 5,612,552 | 3/1997 | Owens | 257/202 |

FOREIGN PATENT DOCUMENTS

| 4-3455 | 1/1992 | Japan . |
|---|---|---|
| 6-61359 | 3/1994 | Japan . |

OTHER PUBLICATIONS

Verhaege et al, "Analysis of Snapback in SOI nMOSFETs and its Use for an SOI ESD Protection Circuit", 1992 IEEE International SOI Conference Proceedings, Ponte Vedra Beach Florida, Oct. 6–8, 1992, pp. 140–141.

Silvestri et al, "Reproducible Technique for Simultaneous Deposition of Poly–Epi on Oxide–Silicon", IBM Technical Disclosure Bulletin, vol. 23, No. 2, Jul. 1980, pp. 819–820.

Chan et al, "Comparison of ESD Protection Capability of SOI and BULK CMOS Output Buffers", Proccedings of the 32nd Annual International Reliability Physics Conference, Apr. 12–14, 1994.

Verhaege et al, "Double Snapback in SOI nMOSFET's and its Application for SOI ESD Protection", IEEE Electron Device Letters, vol. 14, No. 7, Jul. 1993, pp. 326–328.

Voldman et al, "CMOS–on–SOI ESD Protection Networks", Electrical Overstress/Electrostatic Discharge Symposium Proceedings, 1996, Paper 6.5.

*Primary Examiner*—Charles Bowers
*Assistant Examiner*—Thanh Nguyen
*Attorney, Agent, or Firm*—Pollock, Vande Sande & Amernick; Howard J. Walter, Jr.

[57] ABSTRACT

Electrically conductive studs are employed to interconnect bulk active devices and SOI devices in a semiconductor device. Also provided is a method for fabricating such devices.

6 Claims, 6 Drawing Sheets

ELECTRICAL CONTACT TO BURIED SOI STRUCTURES

This is a divisional of application Ser. No. 08/835,128 filed Apr. 4, 1997, now U.S. Pat. No. 5,889,293.

DESCRIPTION

1. Technical Field

The present invention is concerned with an SOI semiconductor device that includes both bulk active devices and SO devices. More particularly, the present invention is concerned with providing electrical interconnection between devices both above and beneath the dielectric of the SOI structure. The present invention is also concerned with a process for fabricating these devices and for providing the necessary electrical interconnection. The present invention is especially concerned with the back end of line (BEOL) contact to buried SOI structures.

2. Background of the Invention

MOSFET scaling on bulk silicon has been the primary focus of the semiconductor and microelectronic industry for achieving CMOS chip performance and density objectives. The shrinking of MOSFET dimensions for high density, low power and enhanced performance requires reduced power-supply voltages. Because power consumption, P. is a function of capacitance, C, power supply voltage, V, and transition frequency, f, where $P=CV'-f$, the focus has been on reducing both C and V as the transition frequency increases. As a result, dielectric thickness and channel length are scaled with power-supply voltage. Power-supply reduction continues to be the trend for future low-voltage CMOS. However, with power supply reduction, transistor performance is severely impacted by both junction capacitance and the MOSFET body effect at lower voltages. As technologies scale below $0.25\ \mu m$ channel lengths, to $0.15-$ and $0.1\ \mu m$, short-channel effects (SCE) control, gate resistance, channel profiling and other barriers become an issue for advanced CMOS technologies. While significant success has been achieved with successive scaling of bulk CMOS technology, the manufacturing control issues and power consumption will become more difficult to deal with.

Using silicon-on-insulator (SOI) substrates, many of the concerns and obstacles of bulk-silicon CMOS can be eliminated at lower power supply voltages. CMOS-on-SOI has significant advantages over bulk CMOS technology and will achieve the scaling objectives of low power and high performance for future technologies. CMOS-on-SOI provides low power consumption, low leakage current, low capacitance diode structures, good sub-threshold I–V characteristics (better than 60 mV/decade), a low soft error rate from both alpha particles and cosmic rays, good SRAM access times, and other technology benefits. SOI technology allows for the mapping of standard advanced technologies into an SOI technology without significant modifications. SOI process techniques include epitaxial lateral overgrowth (ELO), lateral solid-phase epitaxy (LSPE) and full isolation by porous oxidized silicon (FIPOS). SOI networks can be constructed using the semiconductor process of techniques of separation by implanted oxygen (SIMOX) and wafer-bonding and etch-back (SIBOND) because they achieve low defect density, thin film control, good minority carrier lifetimes and good channel mobility characteristics. Structural features are defined by shallow-trench isolation (STI). Shallow-trench isolation eliminates planarity concerns and multidimensional oxidation effects, such as LOCOS bird's beak, thereby allowing technology migration and scaling to sub-$0.25\ \mu m$ technologies.

There are multiple concerns in SOI technology. Thermal dissipation of the electrical-current generated self heating is a concern. In this case, the ability to establish a low-thermal resistance contact to the bulk (e.g., thermal contacts) can reduce this concern.

In thin-film SOI technology, there are no vertical diodes, vertical transistors, vertical pnpn or other bulk type elements normally used for analog applications. Analog circuit and device elements that can be placed in the bulk silicon can be used to reduce chip area and achieve bulk-silicon like circuit operation.

Another barrier is electrostatic discharge protection (ESD). One problem with SOI is that there are no diodes natural to the process that are not in the presence of a polysilicon gate edge. In thin-film SOI technology, there are no vertical diodes, vertical transistors, vertical pnpn or other bulk type elements normally used for electrostatic discharge protection. ESD circuit and device elements that can be placed in the bulk silicon can be used to reduce chip area and achieve bulk-silicon like circuit operation. To achieve ESD robustness in a mainstream SOI technology suitable for high volume commercial usage, ESD protection structures and circuitry must have low resistance and capacitance as well as a small percentage of semiconductor chip area. The disadvantage of SOI ESD networks is 1) high thermal impedance to the bulk substrate, 2) thin films, 3) polysilicon gate structures, and 4) the lack of vertical silicon diodes. The high-thermal impedance creates high surface temperatures in the SOI film leading to thermal secondary breakdown in SOI devices. The thin film SOI devices leads to high current densities creating significant power/density constraints. The polysilicon gate structures create high capacitance and are prone to electrical overload and dielectric breakdown. The lack of vertical structures prevents electrical current to be dissipated to the bulk and forces construction of wide perimeter lateral structures. As a result, a disadvantage for SOI is that negative pulse ESD protection is as difficult as the positive pulse ESD protection. In bulk silicon, using comparatively smaller structures, ESD protection for negative mode pulses is easily achieved because of current dissipation to the bulk substrate; in SOI this is not true. This forces designers to allocate as much area for negative mode as the positive mode protection schemes.

In the prior art, there are different alternatives suggested to date to achieve ESD protection. Standard circuits are constructed in SOI and used for ESD protection. K. Verhaege et al. ("Analysis of Snapback in SOI NMOSFETs and its Use for an SOI ESD Protection Circuit," Proceedings of the IEEE SOI Conference, pp. 140–141. 1992), and ("Double Snapback in SOI NMOSFETs and its Application for SOI ESD Protection," IEEE Electron Device Lett., Vol. 14, No. 7, July 1993, pp. 326–328) demonstrates that usage of a SOI MOSFET transistor as an ESD protection device. Lu (U.S. Pat. No. 4,989,057, ESD Protection for SOI Circuits) demonstrates the usage of transistors in the SOI film for ESD protection. Voldman et al. ("CMOS-on-SOI ESD Protection Networks," EOS/ESD Proceedings, Sept. 1996) demonstrates that thin film SOI ESD devices can be constructed by configuring MOSFETs in diode modes of operation. The first problem is that SOI-based ESD circuits are worse than bulk devices by at least a factor of 2×. M. Chan et al. ("Comparison of ESD Protection Capability of SOI and Bulk CMOS Output Buffers," IRPS 1994) have demonstrated that SOI circuits are 2× less ESD robust. This then will require very large ESD networks which will be unacceptable in size or capacitance loading. A second problem is that the structures are all MOSFET based. All of the above structures introduce a polysilicon gate structure. The concern with the polysilicon gate structure is dielectric overload and high capacitance per unit width. Both of these solutions are unacceptable from a reliability and functional perspective.

In the implementations, the structures utilize only bulk elements adjacent to the active core SOI circuitry. Kawai, U.S. Pat. No. 4,889,829, demonstrates a method of building bulk transistors in the substrate and SOI transistors in the insulating film. In this methodology, it is required that the bulk transistor be constructed adjacent to the active area structures in the same plane. This requires additional chip area devotee to the bulk transistors as well as lopography concerns. Kawai introduces significant topography, which would make it unacceptable for high density and planarity integration issues.

Sun, U.S. Pat. No. 5,399,507, proposed a mixed thin film where ESD devices are constructed in the bulk and where the oxygen implant is masked and core SOI devices are built over the insulating layer. In the concept, the ESD MOSFET structures are placed adjacent to the active integrated circuits in the sam physical silicon plane. This concept eliminates planarity concerns but leads to silicon dislocation, which are unacceptable from a manufacturing perspective. To avoid the silicon dislocations, the active core SOI structures must be spatially separated to avoid yield concerns. This introduces an area disadvantage. Whereas the proposed solutions solve the concern of building ESD networks in the thin SOI film, they do not resolve semiconductor manufacturing problems, yield issues and topography.

In the above, no ESD solution has been proposed that uses ESD structures under active circuitry to eliminate the problem of semiconductor chip area. In Kawai and Sun, the use of SOI MOSFETs and diode structures for ESD devices is avoided by constructing bulk MOSFET devices. In Verhcage and Lu, bulk devices are avoided. Hence in the prior art, there is no obvious incentive to use both bulk and SOT transistors for ESD protection. Also, three-dimensional structures have not been suggested or proposed as ESD solutions. This is because it is not possible to build bulk MOSFETs under SOI MOSFETs. Using a dual-gate MOSFET, Ohmi, U.S. Pat. No. 4,907,053, addresses the problem of back gate biasing in a SOI MOSFET transistor. Ohmi suggests the possibility of constructing a SOI MOSFET with a top gate and a bottom gate where the bottom gate is placed in the bulk and the top gate is above the SOT film. The implementation suggested by Ohmi interconnection is not addressed in the structure.

Structural elements that need to be interconnected are the MOSFET top gate, bottom gate, body, and source/drain diffusions and bulk structural elements.

SOI structures can contain a top gate and bottom gate structure. In SIBOND implementations, a buried bottom gate can exist within the buried oxide layer. In a SIMOX implementation, a diffused second gate can be present and formed in the silicon substrate. Interconnect structures arc needed to establish electrical connections between the silicon surface, the body, bottom gate, and bulk device elements. Interconnect elements between the different elements can be advantageous for single gate CMOS-on-SOI, dual gate CMOS-on-SOI, dynamic threshold MOSFETs (DTMOS). In dynamic threshold MOSFETs, the body of the MOSFET is used to dynamically vary the threshold voltage of the MOSFET transistor.

An issue of SOI is the "body contact." A concern is the additional areas needed for establishing an electrical connection between the body and an electrical potential. In bulk CMOS, the substrate acts as the natural ground plane for the "MOSFET body." In SOI, new three dimensional structures are advantageous for establishing connections between the body and power supply connections, bulk devices or bulk contacts.

An advantage in dual-gate CMOS-on-SOI, interconnects to connect either a buried gate or a diffused bulk gate can be advantageous to avoid additional silicon area.

In dynamic threshold MOSFETs, interconnects to connect either a buried gate or a diffused bulk gate to the MOSFET body can be advantageous to reduce additional silicon area.

For three dimensional circuits, that consist of either bulk elements, or both bulk, and SOI elements, interconnections between these elements are needed to reduce additional silicon area.

For bulk ESD networks, that consist of either bulk elements, or both bulk and SOI elements, interconnections between these elements are needed to reduce additional silicon area.

SUMMARY OF INVENTION

The present invention relates to the problem of ESD protection in SOI technologies and interconnections for formation of three dimensional ESD networks.

The present invention addresses the problem of high perimeter, space intensive ESD networks by construction of three dimensional SOI structures where the ESD networks are below the active core circuitry.

The present invention avoids the problem of high perimeter, high capacitance polysilicon gate structures by construction of interconnections for diode based ESD networks in the bulk silicon.

The present invention addresses the problem of high perimeter, space intensive ESD networks by construction of three dimensional interconnect SOI structures where the ESD networks are in the bulk and in the SO film either above or adjacent or the bulk ESD networks.

The present invention provides interconnect structures for three dimensional dynamic threshold MOSFET SOI circuits.

The present invention makes possible the use of the bulk silicon for a portion of the device structure. In particular, the present invention provides for electrical connection between devices in the bulk silicon and those buried in the silicon-on-insulator structure.

In particular, the present invention is concerned with a silicon-on-insulator semiconductor device that contains both bulk active devices and silicon-on-insulator devices and electrically conductive studs that interconnect bulk active devices and silicon-on-insulator devices.

In addition, the present invention is concerned with a method for fabricating and forming electrical interconnection between bulk active devices and silicon-on-insulator devices in an silicon-on-insulator semiconductor device.

The process of the present invention includes providing active devices in the SOI bulk substrate;
   providing a top semiconductor substrate material located above said SOI bulk substrate;
   providing active devices on the top semiconductor substrate material;
   providing a dielectric layer on the top semiconductor substrate;
   delineating contact trenches between active devices on the top semiconductor substrate material and the active devices in the SOI bulk substrate; and depositing metallic-type high conductivity electrical interconnection material in the trenches to thereby provide the desired electrical interconnection.

In addition, another aspect of the present invention includes providing insulation so as to isolate the electrical interconnection from the top semiconductor layer.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications and various obvious respects, without departing from the invention. Accordingly, the drawings and description are to be regarded as illustrative in nature and not as restrictive.

BEST AND VARIOUS MODES FOR CARRYING OUT INVENTION

To facilitate an understanding of the present invention, reference will be made to the figures. For convenience, when the discussion of the fabrication steps of the present invention refer to a particular type of substrate and/or particular type of dopant impurities, it is understood that the present invention is applicable to the opposite type without departing from the spirit of the present invention. For instance, when reference is made to a p-type silicon substrate as the semiconductive substrate and n-type impurities as diffused or implanted dopant impurity, it is understood that an n-type substrate and p-type diffused or implanted dopant impurities are likewise suitable. In addition, it is understood that when the discussion refers to n-type impurities, the process steps are applicable to p-type impurities and vice versa. Also, when reference is made to impurities of a "first type" and to impurities of a "second type." it is understood that the "first type" refers to an/or p-type impurities and "second type" refers to the opposite conductivity type. That is, if the "first type" is p, then the "second type" is n. If the "first type" is n, then the "second type" is p.

Also, the present invention is applicable to substrates other than silicon which are known in the art. Moreover, as used herein, the terms "metallic-type interconnection material" or "high electrical conductivity interconnection material" refers to metals such as aluminum, copper, and tungsten, as well as to non-metallic materials such as higher doped polysilicon or intermetallic sulicides which nevertheless can have electrical conductivities of the magnitude generally possessed by metals. Moreover, the terms "polysilicon" and "polycrystalline silicon" are used herein interchangeably as in the prior art.

Figure 1:
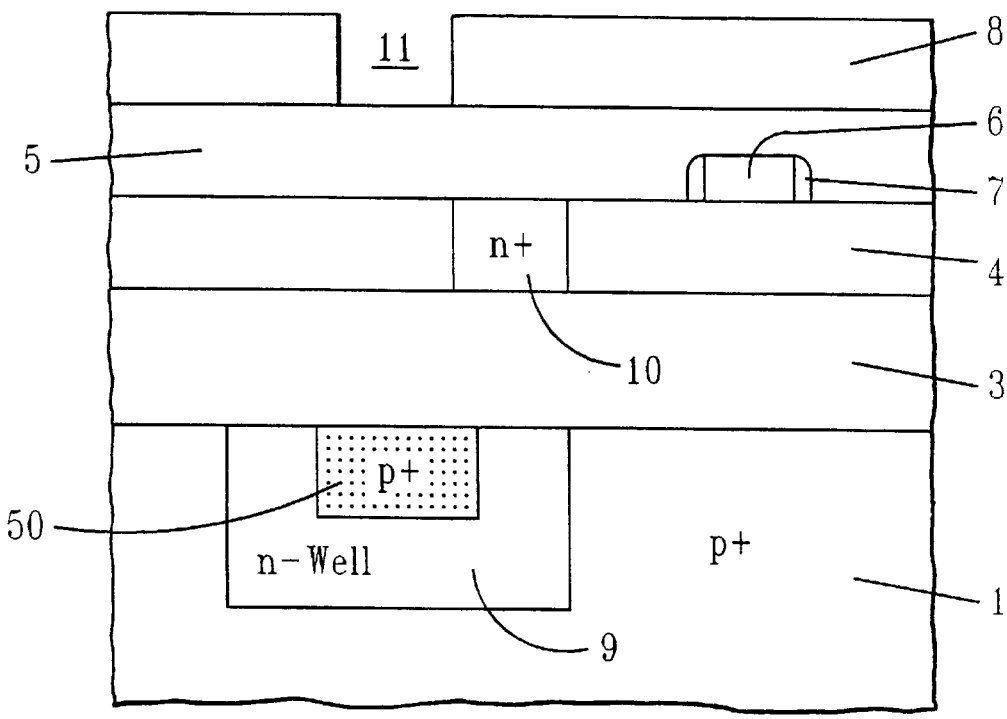
FIGS. 1 and 2 are schematic diagrams of the structure at different stages of the processing according to the present invention.

FIG. 1 illustrates providing an n-well region 9 in a p- or p+-silicon wafer 1. The n-well region 9 can be provided by well known ion implantation or diffusion techniques. In the case where the well is the same polarity as the substrate, it will serve as a contact to the substrate. Contained within the n-well a second implant region 50 can be defined of either a p+ or n+ dopant type. In the case of an n+ implant, region 50 will serve as a contact to the n-well. In the case of a p+ implant, region 50 and 9 will serve as either a p-n diode (formed between the p+ implant and n-well) or as a vertical bipolar transistor (formed from the p+ implant, well and substrate (regions 50, 9 and 1). These elements can be used for contact, analog functions, or ESD networks. CMOS or BiCMOS circuit applications. N-type dopants for silicon are typically phosphorous and arsenic. P-type dopants for silicon include boron. An insulator layer 3 is provided on the bulk silicon wafer 1. Examples of suitable insulator layers include silicon dioxide and silicon nitride. An oxide layer can be grown on the silicon substrate 1 by a thermal oxidation process or by chemical vapor deposition of silicon dioxide such as using gas mixtures of $CO_2/SiH_4/N_2$ or $N_2O/SiH_4/N_2$ at temperatures of about 800–1000° C.

This isolation layer 3 can be referred to as the buried isolation layer.

Next, a top semiconductor substrate material 4 such as silicon can be provided above the isolation layer 3. For instance, a silicon layer 4 can be grown by a gas-solid or heterogeneous reaction system. In particular, such reaction system desirably includes hydrogen, silicon and chlorine. A typical system being a combination of $SiCl_4$—$H_2$ as disclosed by Silvesteri and Tang, Reproducible Technique for Simultaneous Deposition of Poly-Epi on Oxide-Silicon, IBM Technical Disclosure Bulletin, Volume 23, No. 2, July 1980, pp. 810–820, disclosures of which are incorporated herein by reference. The silicon layer 4 can be doped either in n-type or p-type, depending on the desired structure. The doping can be carried out by ion implantation or thermal diffusion. FIG. 1 illustrates n+ doping 10.

Next, a dielectric layer 5 is formed on the top semiconductor substrate layer 4 along with active devices which in the case of FIG. 1 is a gate 6. The gate 6 can be provided, for instance, by depositing a layer or polycrystalline silicon by chemical vapor deposition followed by doping such as with an n-type dopant such as arsenic, phosphorous or antimony by any one of several techniques. A thick additional layer of silicon dioxide can be deposited on the polysilicon, such as by chemical vapor deposition. This serves as an etching mask to help delineate the polycrystalline material. The gate 6 with the oxide 7 remaining on its sides can be delineated by well known technique. For instance, a gate pattern determining layer such as a layer of resist material of the type employed in known lithographic masking and etching techniques can be placed over the surface of the oxide. Any of the well-known photosensitive polymerizable resist materials known in the art may be used. The resist material can be applied such as by spinning on or by spraying.

After the layer of resist material is applied, it can then be selectively exposed to ultraviolet radiation using an photolithographic mask. The mask would have transparent material having opaque portions in a predetermined pattern to define the gate. The masked wafer is then subjected to ultraviolet light which polymerizes the portion of the resist material underlying the transparent regions of the mask. The portions of the silicon dioxide and photoresist material are then removed, followed by removal of those portions of the polysilicon except for the desired gate region. Next, the remaining portions of the photoresist material and silicon dioxide material above the gate region is removed.

Next, an insulating layer 5 is formed. This insulation layer can be grown on or deposited onto the assembly. Such can be silicon dioxide and can be prepared by chemical vapor deposition.

Contact trenches 11 are then delineated between the active device on the top semiconductor substrate 4 and the active device in the SOI bulk substrate 1. The trenches can be delineated by well known lithographic means. In particular, a photosensitive material can be provided on the oxide layer 5 followed by usual delineation and development of the photosensitive material to define the areas where the trench is to be provided. Next, the portion uncovered by the removal of photoresist material can be etched by any of the well known techniques, such as reactive ion etching, such as that disclosed in U.S. Pat. No. 4,283,249 to Ephrath, disclosure of which is incorporated herein by reference. In particular, a gaseous mixture containing a fluorocarbon and gas capable of supplying hydrogen can be used to etch the silicon dioxide. In the alternative, a wet chemical composition, such as buffered hydrofluoric acid can be used to dissolve the silicon dioxide. The exposed silicon layer can then be etched by using reactive ion process such as that disclosed in U.S. Pat. No. 4,256,514 to Pogge, disclosure of which is incorporated herein by reference.

The oxide layer 3 is then etched, such as using reactive ion etching to complete the trench.

The trench 11 is then filled with a metallic-type high conductivity electrical interconnection material 12 (see FIG. 2) to thereby provide the electrical interconnection between the devices above and below or within the buried oxide. The electrical interconnections can include metals such as tungsten, copper and aluminum, and highly doped polycrystalline silicon. The trench can be filled with higher doped polycrystalline silicon by the technique disclosed in U.S. Pat. No. 4,473,598 to Ephrath et al., disclosure of which is incorporated herein by reference. The metals can be provided by chemical vapor deposition or by providing properly sized metal wire. In the case of metal, typically an intermediate layer, such as titanium or tantalum 13 is provided between the oxides and silicon layers and tungsten, copper or aluminum, to enhance the adhesion. For instance, when using tungsten and aluminum, typically titanium cladding is employed. When using copper, typically a tantalum cladding is employed.

Figure 2:
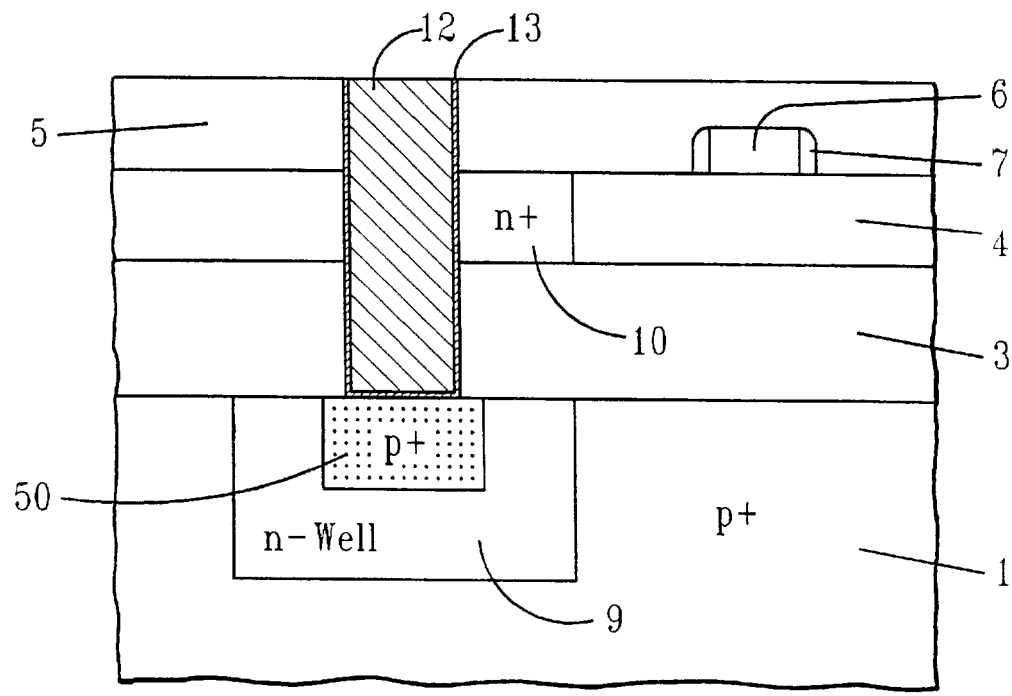

FIG. 2 illustrates the electrical interconnection between the device such as the gate structure 6 or other CMOS devices to the bulk active devices.

Figure 3:
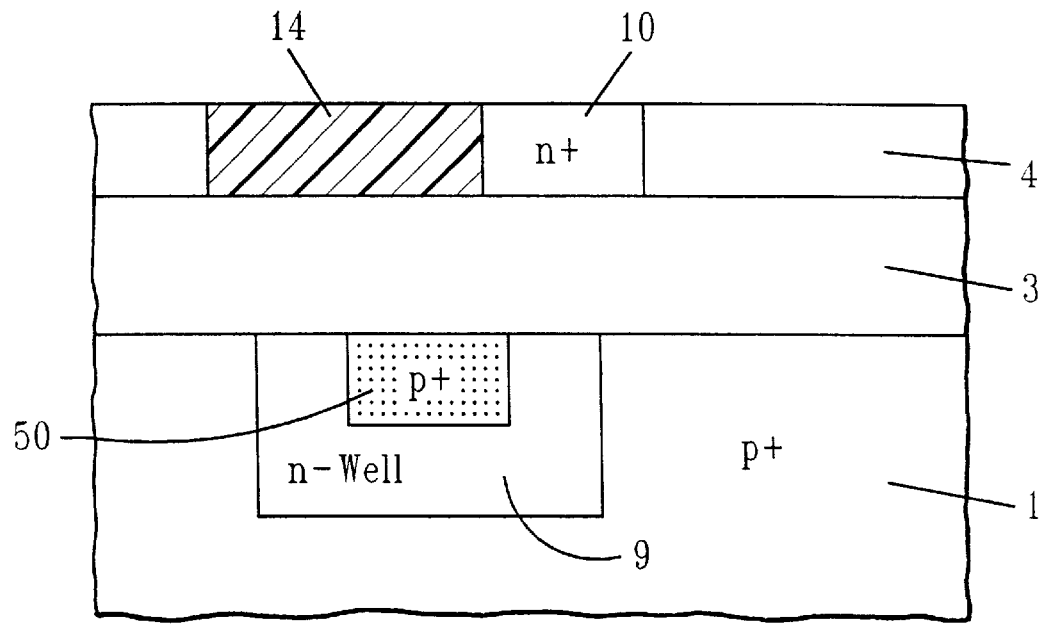
FIGS. 3 and 4 are schematic diagrams of the structure in different stages of the embodiment of the present invention employing an isolation trench.
Figure 4:
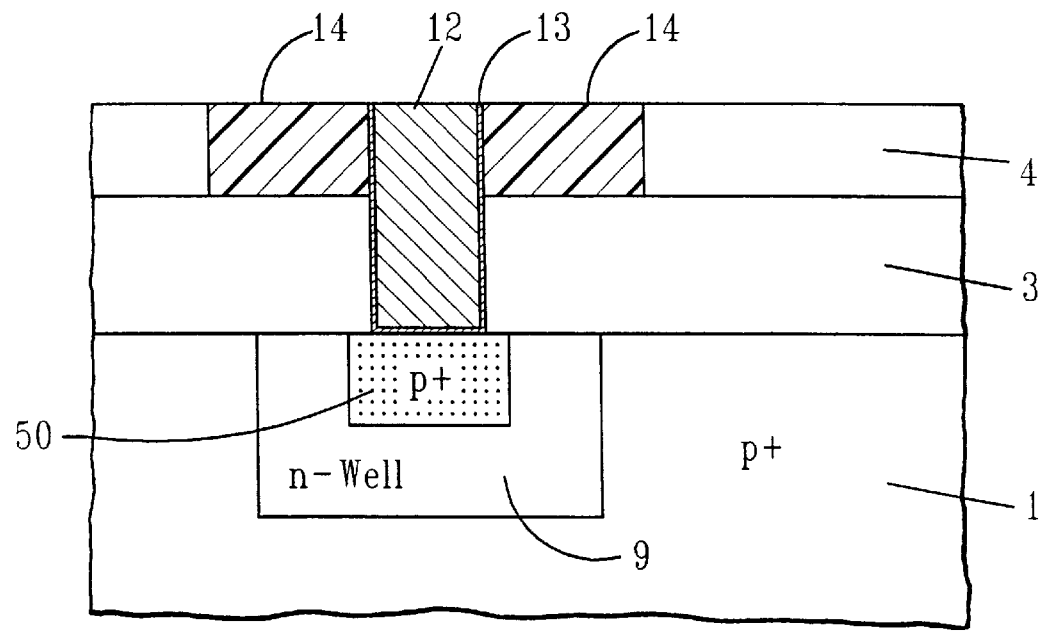

FIGS. 3 and 4 illustrate providing an isolation trench 14 in the top silicon layer as a further embodiment of the present invention. In this case, the procedure employed can include first providing the active devices in the SOI bulk silicon as discussed above, such as the n-type well 9. This is followed by forming an isolation trench 14 in the top silicon layer 4 using well known techniques, such as that disclosed in U.S. Pat. No. 4,104,086 to Bondur et al., disclosure of which is incorporated herein by reference. The insulation trench can then be filled with an oxide or dielectric followed by planarizing to the silicon surface. Another technique for forming isolation trench is disclosed in U.S. Pat. No. 5,312,777 to Cronin et al., disclosure of which is incorporated herein by reference. In this technique, a spacer is formed in a contact hole that electrically isolates the contact from the surrounding films. This technique could be used for form spacers within the interconnect structure that would isolate the interconnect from the silicon top layer.

After the isolation 14 is provided as shown in FIG. 3, the device is fabricated according to the sequence discussed above to provide a structure as illustrated in FIG. 4. The contact can then be made to devices fabricating in a plane perpendicular to the surfaces shown.

As discussed above, a well region 9 can contain a second region 50 which is contained within the region 1. The function of the bulk device is dependent on the dopant polarities of the three regions. In the case when region 9 and region 50 and region 1 are the same, it is a bulk electrical or thermal contact. In the case when region 9 and region 50 are the same but opposite of region 1, it is a diode. In the case when region 9 and region 1 are the same but opposite of region 50, it is a diode. In the case when region 50 and region 1 are the same but opposite of region 9, it is a bipolar transistor.

Figure 5:
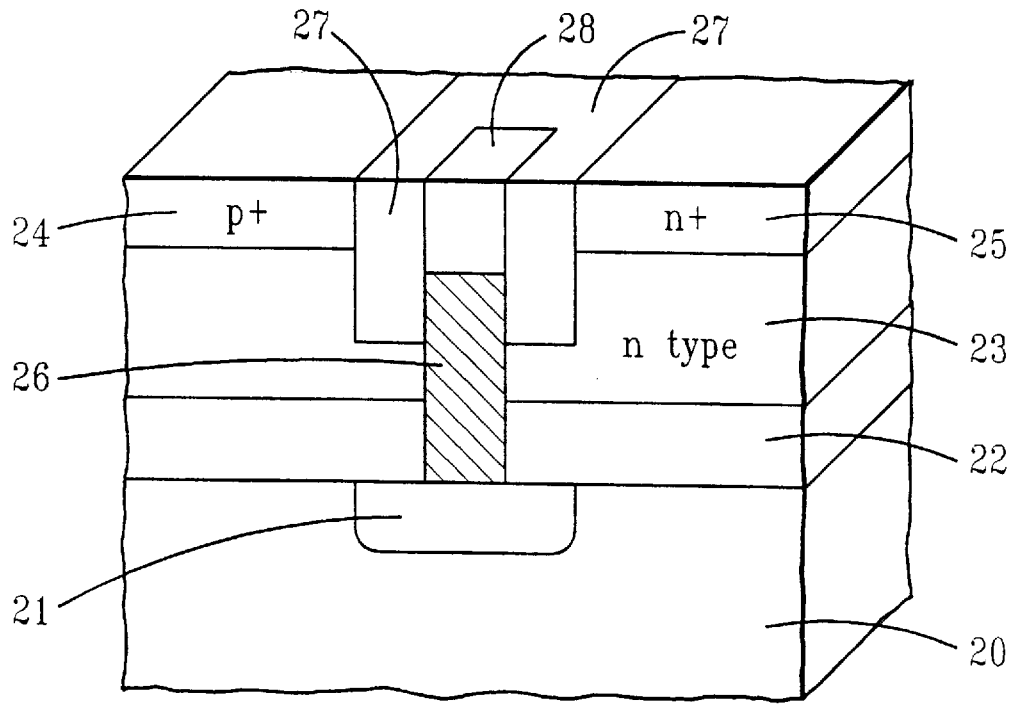
FIG. 5 is an isometric view of a structure in accordance with the present invention.

FIG. 5 illustrates a structure according to the present invention wherein an active region 21 in substrate 20 is interconnected to the doped active layer 23. Substrate 23 and 20 are separated by buried insulating layer 22. On the top of layer regions 24 and 25 are implants of the same or opposite polarity, for example source/drain MOSFET implants. Electrical interconnect 26 is partially isolated for example by an insulation 27 and a top insulation 28.

Region 21 can be at least one implant of the same or opposite Polaris as the bulk substrate 20. The function of the structure is dependent on the dopant polarities of the three regions. In the case when region 23 and region 21 and region 20 are the same, it is a bulk electrical or thermal contact. In this case, it also serves as a SOI MOSFET "body contact." In the case when region 23 and region 21 are the same but opposite of region 20, the SOI MOSFET body and region 21 form a diode to the bulk substrate. In the second case, the diode can be used for circuit applications, a voltage clamp. ESD protection, and any other circuit function.

Figure 6:
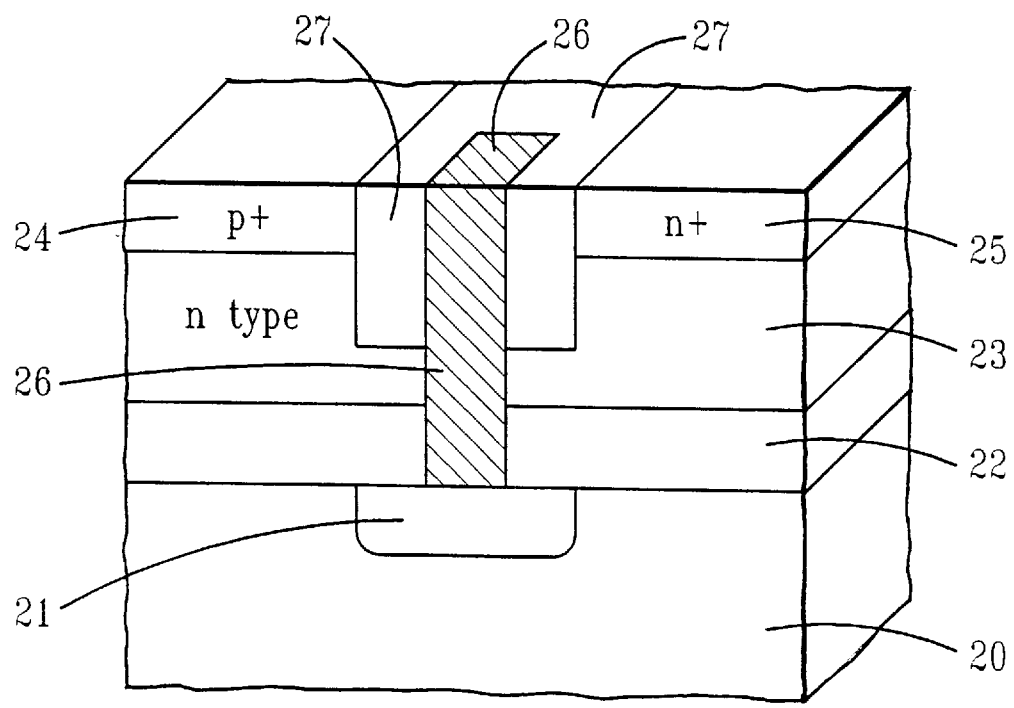
FIG. 6 is an isometric view of an alternative embodiment of the present invention.

FIG. 6 illustrates a structure similar to that in FIG. 5 except that the interconnection 26 extends all the way to the top of the silicon 23 and does not include the insulation 28. The structure in FIG. 6 provides a top contact to both the SOI MOSFET body and the bulk device. As a result, it will serve as a MOSFET "body contact" and bulk device contact. If the polarity of region 21 is the same as region 20, then it serves as both a MOSFET body contact and a bulk contact.

Conductive region 32 can serve as a second gate of the SOI MOSFET. In this case, the conductive region 32 must be placed under the SOI MOSFET channel region and the gate insulator is formed between the film 35 and buried oxide region 35 above conductive region 32. This second gate achieves improved SOI MOSFET characteristics. The conductive region 32 can also serve as a gate for a bulk thick oxide MOSFET below in the bulk. In this case, the gate dielectric is the buried oxide region below conductive film 32.

Figure 7:
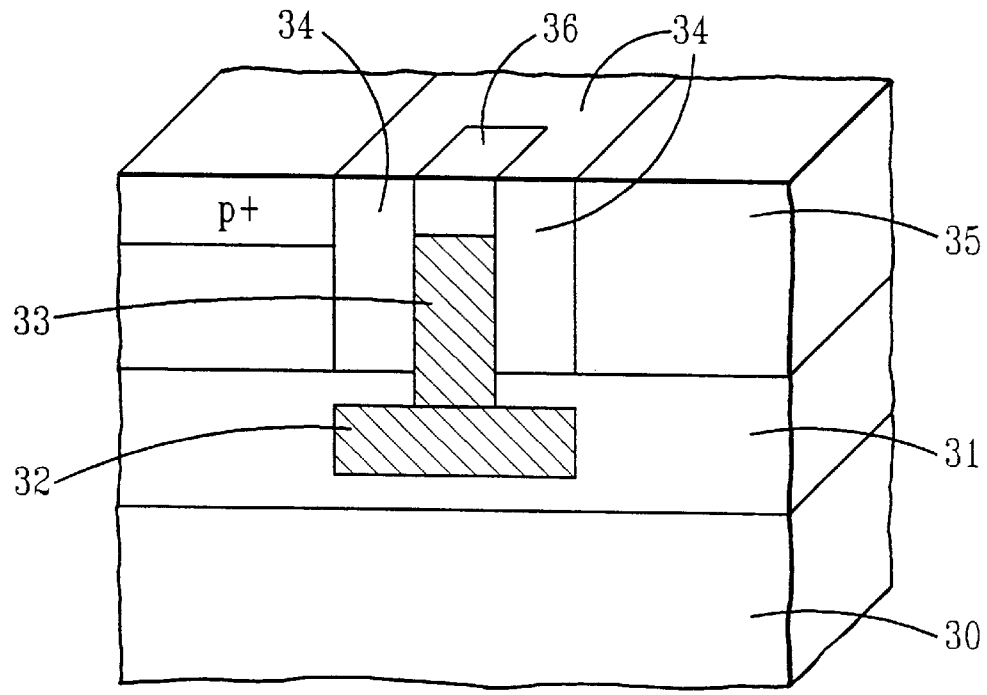
FIG. 7 is a schematic diagram of a still further embodiment of the present invention.

FIG. 7 illustrates a structure whereby a conductor 32 buried within buried insulating layer 31 atop substrate 30 is interconnected to interconnector 33. This in turn can be connected to an active device (not shown) positioned perpendicular to the surface of this figure. As noted, insulating layer 34 isolates interconnector 33 entirely from top silicon substrate 35. In addition, insulator 36 isolates interconnect conductor 33 from the top of the substrate 35. The particular configuration of FIG. 7 can be fabricated by using a SIBOND process. In a Sibond process, two wafers are baked together each having an oxide layer wherein the oxide layers contact each other. In particular, a first silicon substrate having an oxide provided thereon is etched to provide a via or conduit for subsequent filling to provide the conductor 32. Next, a silicon wafer having an oxide layer thereon is contacted with the oxide layers adjoining providing a sandwich of oxide between the two silicon wafers. The structure is then baked at temperatures of about 1300° C. to about 1400° C. for several hours, after which the top silicon layer 35 is subjected to a polishing in order to reduce its thickness. After this, the remainder of the device is fabricated in the manner discussed hereinabove. The conductor 32 can act as a contact to a back gate or wiring level, can be connected to an active device (not shown) positioned perpendicular to the surface of this figure.

Figure 8:
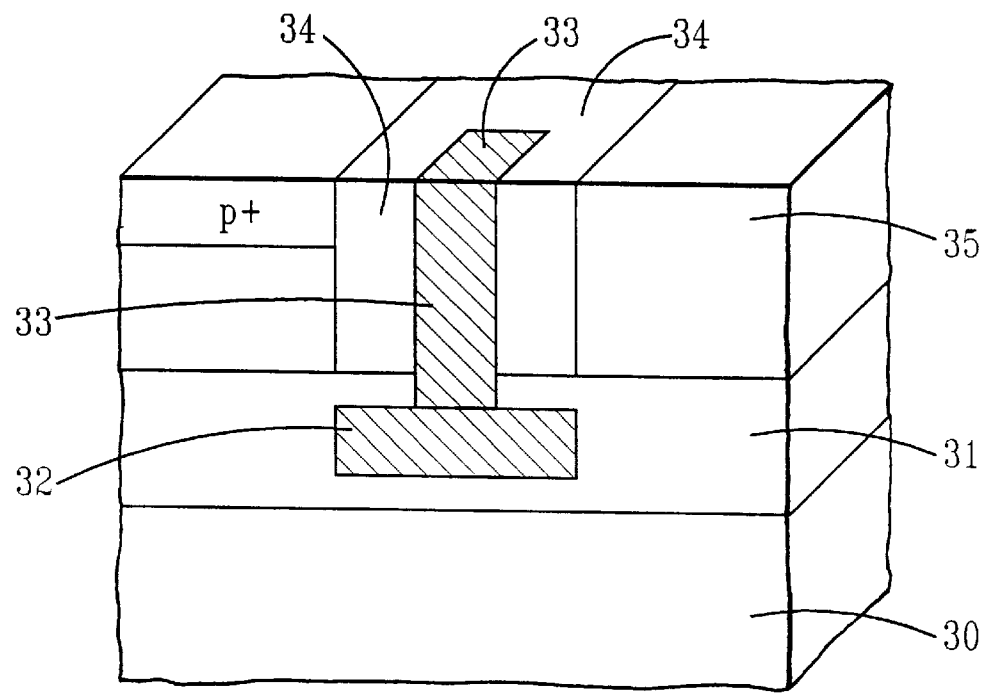
FIG. 8 is a partial isometric view of another embodiment of the present invention.

FIG. 8 illustrates a structure similar to that of FIG. 7 except that the interconnect conductor 33 extends to the top of the top substrate 35 and is not isolated from the top of the substrate 35 as is the structure in FIG. 7. In this case, an application is the ability to bias conductive region 32. In this way, the back-gate can be biased for improved SOI MOSFET characteristics using the top and bottom gate.

Figure 9:
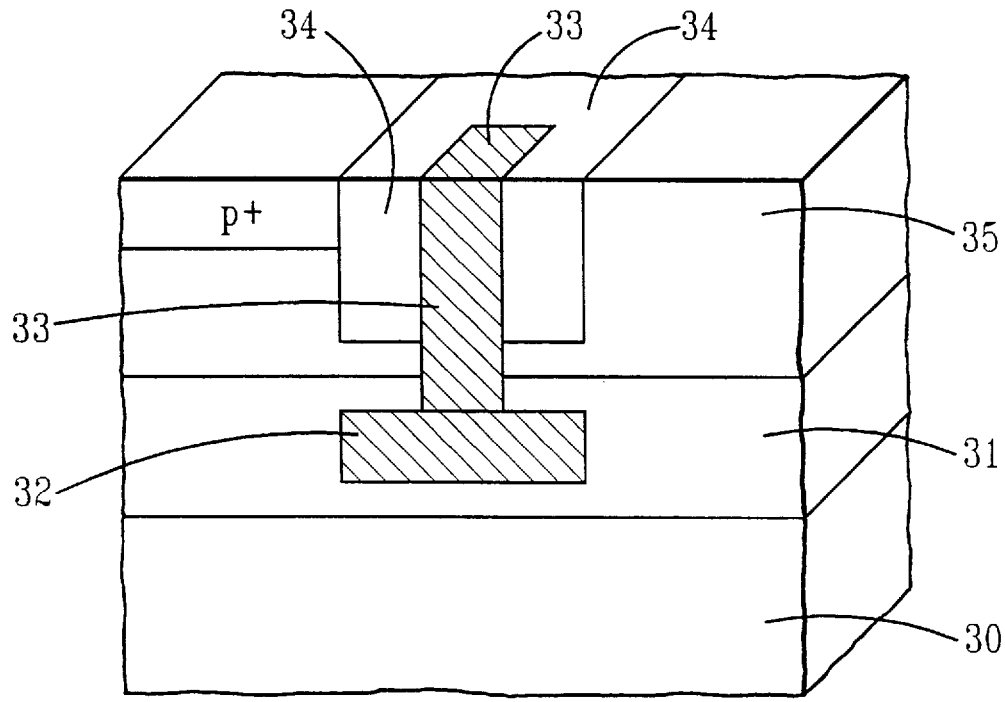
FIG. 9 is a partial isometric view of another embodiment of the present invention.

FIG. 9 is similar to FIG. 8 structure, except that the isolation regions 34 do not extend to the bottom of the top silicon substrate layer 35, but permit electrical contact between the interconnector 33, regions of the doped silicon layer 35 and the conductor 32. In this case, an application of connection of the conductive region 32 to the body 35, providing an interconnect of gate-to-body of the MOSFET. This has application to dynamic threshold MOSFET (DTMOS) devices where the gate and body of the device are connected together.

Figure 10:
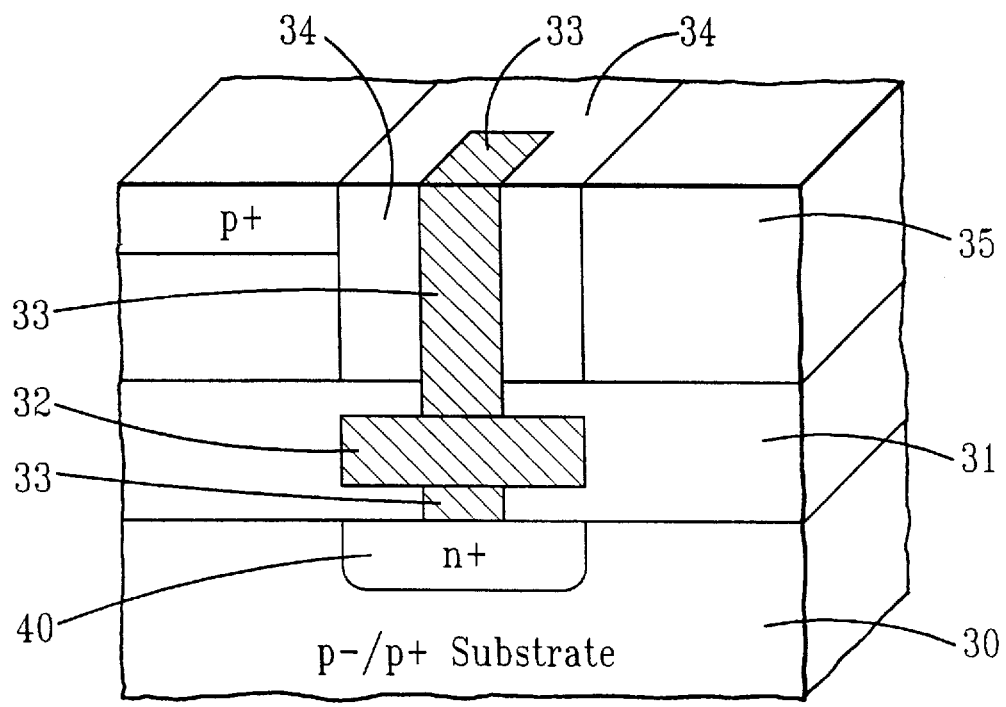
FIG. 10 is a partial isometric view of a still further embodiment of the present invention.

FIG. 10 is similar to FIG. 8 except that interconnect 33 extends to connect to conductor 32 and to active region 40 in silicon substrate 30. In this case, an application of connection of the conductive region 32 to the bulk devices. If the dopant of region 33 is the same as the bulk region 30, then the application is the ability to ground the back gate conductive film 32. If the dopant of region 33 is the opposite of the bulk region 30, then the application is the ability to connect the back gate conductive film 32 to a diode structure. This has application for a gate-tie down to prevent electrical charging of the back gate structure.

Figure 11:
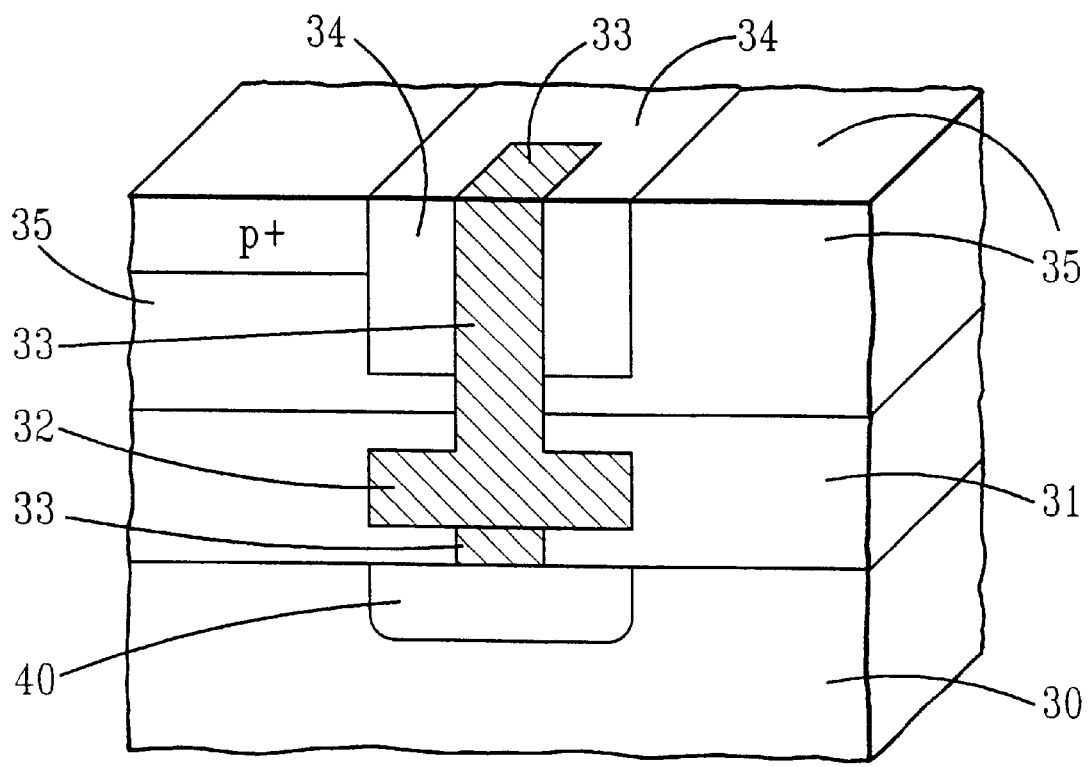
FIG. 11 is a partial isometric view of another embodiment of the present invention.

FIG. 11 illustrates a structure similar to that of FIG. 10 except that isolation 34 does not extend to the bottom of top silicon substrate 35, but permits interconnection between semiconductor substrate 35 and conductor 33 and active region 32 by interconnector 33. In this case, an application of connection of the conductive region 32 to the bulk devices and the body of the MOSFET 35. If the dopant of region 40 is the same as the bulk region 30, then the application is the ability to ground the back gate conductive film 32 and silicon film 35. If the dopant of region 40 is the opposite of the bulk region 30, then the application is the ability to connect the back gate conductive film and film 35 to a bulk diode structure. This has application for a dynamic threshold SOI MOSFET ESD networks, for overvoltage, charging, and other circuit applications.

As can be appreciated, the present invention makes it possible to create countless numbers of different structures. Also, it is understood that various structures can be created whereby the isolation 34 adjoining the conductor 32 extends on only one side of conductor 33.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A method for fabricating and forming electrical interconnection between bulk active devices and silicon-on-insulator devices in a thin film silicon-on-insulator semiconductor device, which comprises:

a) providing active devices in the silicon-on-insulator bulk substrate;

b) providing a top semiconductor substrate material located above said silicon-on-insulator bulk substrate;

c) providing active devices on said top semiconductor substrate material;

d) providing a dielectric layer on said top semiconductor substrate material;

e) delineating contact trenches between active devices on the top semiconductor substrate material and the active devices in said silicon-on-insulator bulk substrate; and f) depositing conductivity electrical interconnection material in said trenches to thereby provide said electrical interconnection; and g) providing insulation so as to at least partially isolate the electrical interconnection from the top semiconductor substrate material.

2. The method of claim 1 wherein said high conductivity electrical interconnection material is selected from the group consisting of tungsten, copper, aluminum and highly doped polycrystalline silicon.

3. The method of claim 1 wherein said dielectric layer is silicon dioxide.

4. The method of claim 1 wherein said step of providing insulation so as to at least partially isolate the electrical interconnection from the top semiconductor substrate material is carried out between steps b and c.

5. The method of claim 1 which comprises providing the insulation to electrically isolate the electrical interconnection from a top surface of the top semiconductor substrate material.

6. The method of claim 1 which comprises providing the electrical interconnection to a top surface of the top semiconductor substrate material.

\* \* \* \* \*

UNITED STATES PATENT AND TRADEMARK OFFICE
CERTIFICATE OF CORRECTION

PATENT NO.   : 6,071,803
DATED        : Jun. 6, 2000
INVENTOR(S)  : Matthew J. Rutten et al.

It is certified that error appears in the above-identified patent and that said Letters Patent is hereby corrected as shown below:

Col. 8, line 36, delete "Polaris" and insert
---polarity---.

Signed and Sealed this

Twenty-second Day of May, 2001

Attest:

NICHOLAS P. GODICI

Attesting Officer

Acting Director of the United States Patent and Trademark Office